United States Patent
Ha et al.

(10) Patent No.: US 7,433,236 B2
(45) Date of Patent: Oct. 7, 2008

(54) MULTI-VOLTAGE GENERATOR GENERATING PROGRAM VOLTAGE, READ VOLTAGE AND HIGH VOLTAGE IN RESPONSE TO OPERATING MODE OF FLASH MEMORY DEVICE

(75) Inventors: Hyun-Chul Ha, Gyeonggi-do (KR); Jong-Hwa Kim, Gyeonggi-do (KR)

(73) Assignee: Samsung Eelctronics Co., Ltd., Suwon-si, Gyeonggi-do (KR)

( * ) Notice: Subject to any disclaimer, the term of this patent is extended or adjusted under 35 U.S.C. 154(b) by 139 days.

(21) Appl. No.: 11/361,118

(22) Filed: Feb. 24, 2006

(65) Prior Publication Data
US 2006/0274579 A1   Dec. 7, 2006

(30) Foreign Application Priority Data
Jun. 7, 2005   (KR) .................. 10-2005-0048416

(51) Int. Cl.
*G11C 11/34* (2006.01)
(52) U.S. Cl. .................. 365/185.18; 365/185.23; 365/189.09
(58) Field of Classification Search ............ 365/185.23, 365/189.09
See application file for complete search history.

(56) References Cited

U.S. PATENT DOCUMENTS

| 6,278,317 | B1 * | 8/2001 | Hsu et al. .................. 327/536 |
| 2005/0030771 | A1 * | 2/2005 | Conte et al. .................. 363/59 |
| 2005/0254313 | A1 * | 11/2005 | Kurihara ................ 365/189.09 |
| 2006/0119383 | A1 * | 6/2006 | Castaldo et al. ............... 326/33 |

FOREIGN PATENT DOCUMENTS

| JP | 2003-091996 | 3/2003 |
| JP | 2003-208794 | 7/2003 |
| KR | 2001-0039045 | 5/2001 |

OTHER PUBLICATIONS

English language abstract of Korean Publication No. 2001-0039045.
English language abstract of Korean Publication No. 2003-091996.
English language abstract of Japanese Publication No. 2003-208794.

* cited by examiner

*Primary Examiner*—Huan Hoang
*Assistant Examiner*—Anthan T Tran
(74) *Attorney, Agent, or Firm*—Marger Johnson & McCollom, P.C.

(57) ABSTRACT

Provided is a multi-voltage generator for a flash memory device including a high voltage pumping unit configured to generate a high voltage in response to an enable signal, voltage regulators, each regulator coupled to the high voltage and a control voltage and configured to generate a pumping signal, and a selector configured to select one of the pumping signals as the enable signal.

16 Claims, 4 Drawing Sheets

MULTI-VOLTAGE GENERATOR GENERATING PROGRAM VOLTAGE, READ VOLTAGE AND HIGH VOLTAGE IN RESPONSE TO OPERATING MODE OF FLASH MEMORY DEVICE

CROSS-REFERENCE TO RELATED PATENT APPLICATION

This application claims the benefit of Korean Patent Application No. 10-2005-0048416, filed on Jun. 7, 2005, in the Korean Intellectual Property Office, the disclosure of which is incorporated herein in its entirety by reference.

BACKGROUND OF THE INVENTION

1. Field of the Invention

This application relates to semiconductor memory devices, and more particularly, to multi-voltage generators generating a program voltage, a read voltage and a high voltage in response to the operating mode of flash memory devices.

2. Description of the Related Art

With the development of mobile information terminals such as cellular phones using digital information communication networks such as the Internet, nonvolatile memory devices are in the spotlight as memory devices capable of storing information of the mobile information terminals in a nonvolatile manner. The nonvolatile memory device includes a flash memory that can electrically erase a predetermined number of bits of data stored therein and electrically record data.

The flash memory includes several sectors, each having several memory cells. The flash memory erases (deletes) memory cell data block by block (sector by sector) and programs (records) data cell by cell. A NAND type flash memory has a level of integration and a memory capacity as high as those of a dynamic RAM and thus it has various uses. The NAND type flash memory has a structure such that a memory string, including memory cells serially connected is serially connected, between a bit line and a source line. Multiple of memory strings from a memory cell array.

Figure 1:
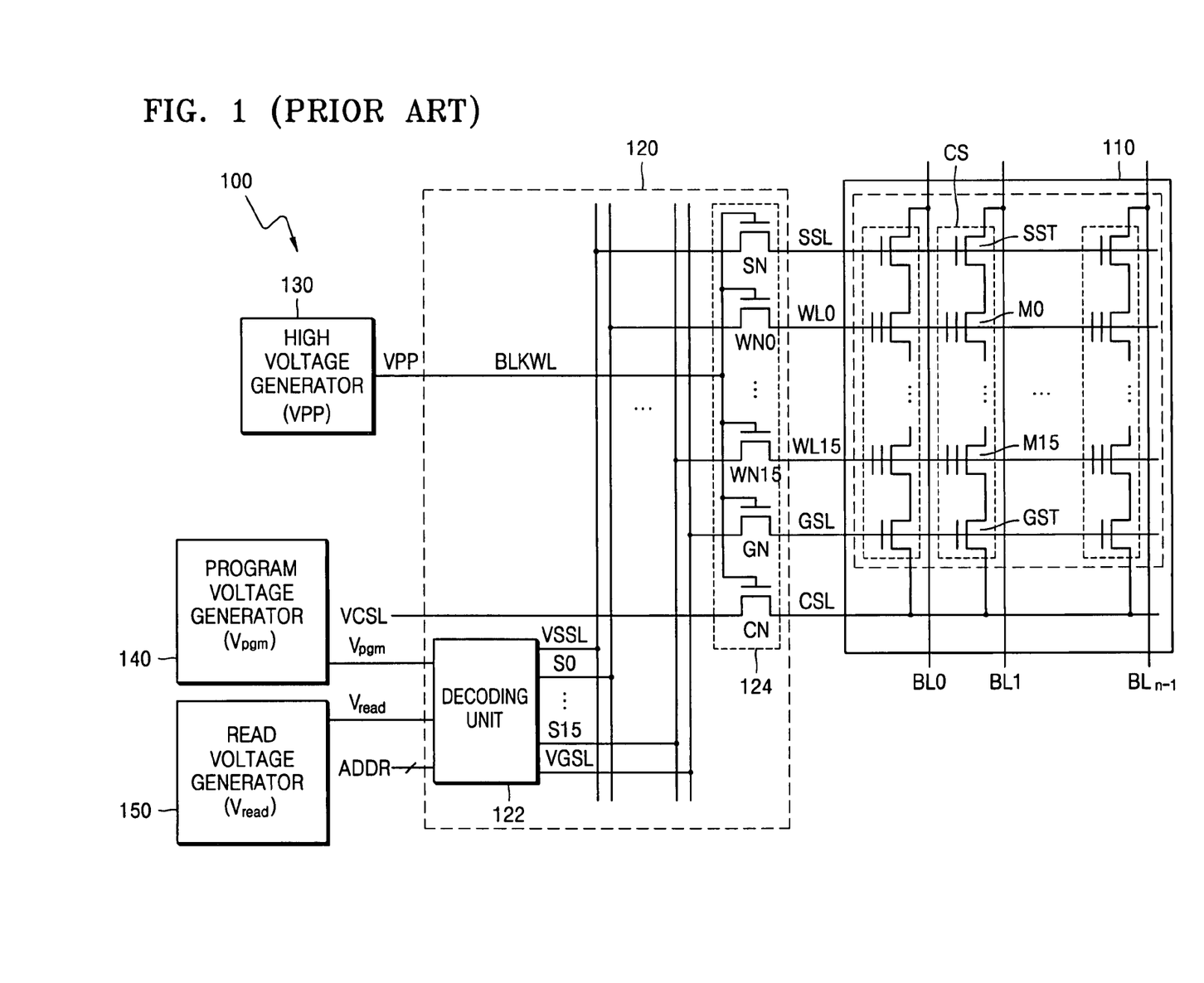
FIG. 1 is a block diagram of a conventional flash memory device.

FIG. 1 is a block diagram of a conventional flash memory 100. Referring to FIG. 1, the flash memory 100 includes a block memory cell array 110, a wordline decoder 120, a high voltage generator 130, a program voltage generator 140, and a read voltage generator 150. The flash memory 100 can include several block memory cell arrays 110. Each block memory cell 110 has a corresponding wordline decoder 120. Although, for convenience of explanation, only one single wordline decoder 120 corresponding to one block memory cell 110 will be explained, flash memory decoders may include multiple block memory cell arrays 110 and wordline decoders 120.

The block memory cell array 110 includes memory strings CS respectively connected to n bit lines BL0, BL1, ..., BLn-1. The memory strings CS are commonly connected to a source line CSL. The gates of memory cells MO through M15 of the memory strings CS are respectively connected to wordlines WL0 through WL15. The gates of string select transistors SST, connecting the memory strings CS to the bit lines BL0, BL1, ..., BLn-1, are connected to a string select line SSL. The gates of ground select transistors GST connecting the memory strings CS to the common source line CSL, are connected to a ground select line GSL.

The wordline decoder 120 selectively activates the string select line SSL, the ground select line GSL, and wordlines WL0 through WL15 of the memory cell array 110. The wordline decoder 120 includes a decoding unit 122 receiving address signals ADDR to generate wordline driving signals S0 through S15, a string select voltage VSSL, a ground select voltage VGSL, and a wordline driver 124 transmitting the wordline driving signals S0 through S15, the string select voltage VSSL and the ground select voltage VGSL to the wordlines WL0 through WL15, the string select line SSL and the ground select line GSL.

The decoding unit 122 decodes the received address signals ADDR and provides corresponding driving voltages to the string select line SSL, the wordlines WL0 through WL15 and the ground select line GSL in a program operation, an erase operation or a read operation. The driving voltages include a program voltage Vpgm, an erasure voltage Verase, a read voltage Vread, and a pass voltage Vpass.

The wordline driver 124 includes high-voltage pass transistors SN, WN0 through WN15, GN and CN respectively connecting the string select voltage VSSL, the wordline driving signals S0 through S15, the ground select voltage VGSL, and a common source line voltage VCSL to the string select line SSL, the wordlines WL0 through WL15, the ground select line GSL, and the common source line voltage CSL. A high voltage VPP generated by the high voltage generator 130 is provided to a block wordline BLKWL to which the gates of the high-voltage pass transistors SN, WN0 through WN15, GN and CN are connected.

The high voltage generator 130 generates the high voltage VPP according to a charge pumping operation. The high voltage VPP has a level of 22V through 25V, for example. The program voltage generator 140 generates the program voltage Vpgm according to a charge pumping operation. The program voltage Vpgm is increased with the number of programming times and has a level of 15V through 20V, for example.

The read voltage generator 150 generates the read voltage Vread according to a charge pumping operation. The read voltage Vread has a level of 4.5V through 5V approximately. Each of the high voltage generator 130, the program voltage generator 140, and the read voltage generator 150 may be a simple voltage generator as shown in FIG. 2.

Figure 2:
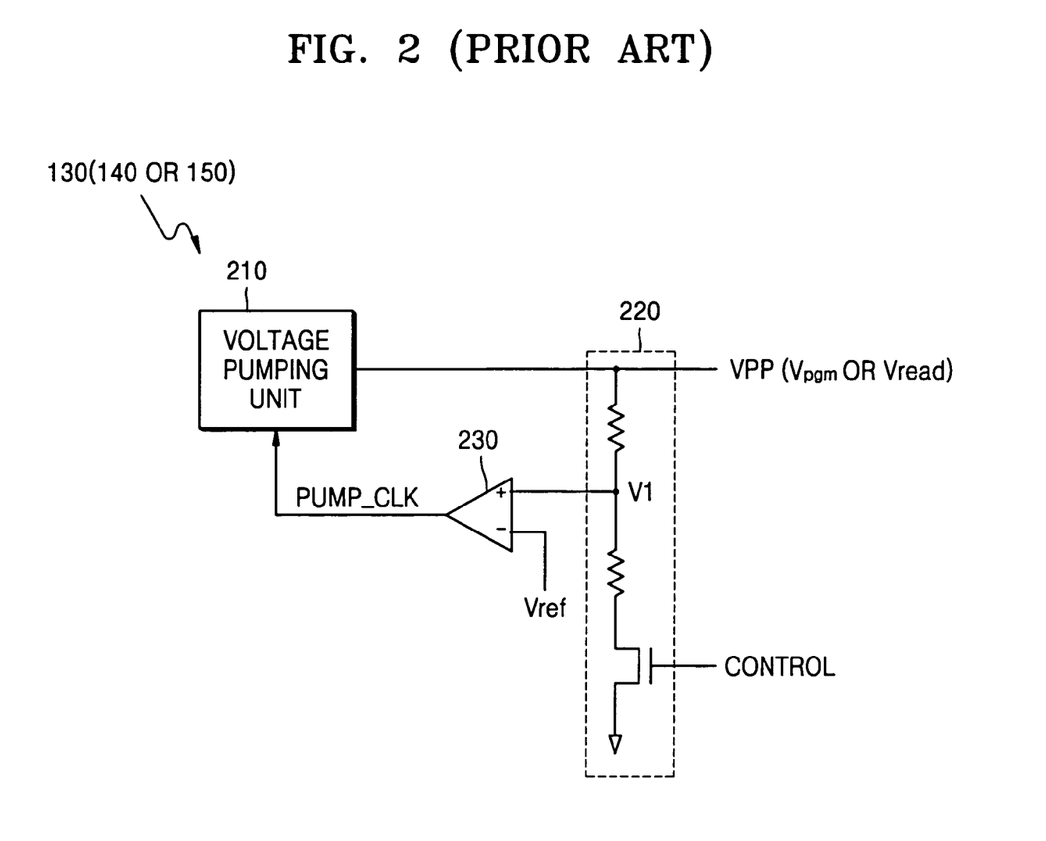
FIG. 2 illustrates a simplified configuration of the program voltage generator, read voltage generator and high voltage generator of FIG. 1.

Referring to FIG. 2, the high voltage generator 130 may include a voltage pumping unit 210 that sequentially pumps charges when a pumping clock signal PUMP_CLK is applied thereto to generate the high voltage VPP. The high voltage VPP is provided to a voltage trimming controller 220. The voltage trimming controller 220 generates a first voltage VI divided from the high voltage VPP in response to a control signal CONTROL. A comparator 230 compares the first voltage V1 to a reference voltage Vref. When the first voltage V1 is lower than the reference voltage Vref, the comparator 230 activates the pumping clock signal PUMP_CLK. The activated pumping clock signal PUMP_CLK enables the charge pumping operation of the voltage pumping unit 210 to increase the level of the high voltage VPP. When the first voltage V1 is substantially identical to or higher than the reference voltage Vref, the comparator 230 deactivates the pumping clock signal PUMP_CLK. The deactivated pumping clock signal PUMP_CLK disables the charge pumping operation of the voltage pumping unit 210.

The control signal CONTROL is used to change the level of the high voltage VPP. Referring to FIG. 1, the high voltage VPP generated by the high voltage generator 130 is provided to the block wordline BLKWL. In a programming operation of the flash memory 100, the program voltage Vpgm is applied to a wordline connected to a memory cell to be programmed, for example, the first wordline WL0, and the pass voltage Vpass is applied to the other wordlines WL1 through WL15. To provide the program voltage Vpgm generated by the program voltage generator 140 to the first wordline WL0, the decoding unit 122 outputs the program voltage Vpgm as the wordline driving signal S0 and the high voltage VPP is applied to the block wordline BLKWL to turn on the pass transistor WN0.

Here, the program voltage Vpgm is increased with the number of programming times. The high voltage VPP has at least a level substantially equal to the threshold voltage Vth of the pass transistor WN0 plus the program voltage Vpgm such that the program voltage Vpgm is transmitted without having voltage drop. However, the high voltage VPP generated by the high voltage generator 130 has a sufficiently high level, for example, 22V through 25V, irrespective of the level of the program voltage Vpgm. The high voltage VPP having a level of 22V through 25V corresponds to a voltage obtained by adding the threshold voltages Vth of the high-voltage pass transistors SN0, WL0 through WL15, GN and CN to the maximum program voltage Vpgm.

However, the threshold voltages Vth of the pass transistors SN0, WL0 through WL15, GN and CN may vary within a semiconductor fabrication process. Accordingly, the high voltage generator 130 requires a trimming operation that controls the level of the high voltage VPP according to the control signal CONTROL.

In the programming operation, the block wordline BLKWL for transmitting the program voltage Vpgm to the wordlines WL0 through WL15 has a voltage level as high as the program voltage Vpgm plus the threshold voltages Vth of the high-voltage pass transistors SN0, WL0 through WL15, GN and CN.

However, the high voltage generator 130 generates the high voltage VPP having a sufficiently high fixed voltage level irrespective of the level of the program voltage Vpgm and transmits the high voltage VPP to the block wordline BLKWL, resulting in unnecessary power consumption. Furthermore, the high voltage generator 130 requires the trimming operation according to the control signal CONTROL when it changes the fixed high voltage level VPP.

Referring to FIG. 2, the program voltage generator 140 and the read voltage generator 150 respectively generate the program voltage Vpgm and the read voltage Vread, similar to the high voltage generator 130.

SUMMARY OF THE INVENTION

An embodiment includes a multi-voltage generator for a flash memory device including a high voltage pumping unit configured to generate a high voltage in response to an enable signal, voltage regulators, each regulator coupled to the high voltage and a control voltage and configured to generate a pumping signal, and a selector configured to select one of the pumping signals as the enable signal.

Another embodiment includes a method of generating voltages for a flash memory device including generating a transferred voltage using a voltage transfer unit in response to a high voltage and a control voltage, comparing the transferred voltage with reference voltages generating enable signals from the comparisons, selecting one of the enable signals, and changing the high voltage in response to the selected enable signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

Figure 3:
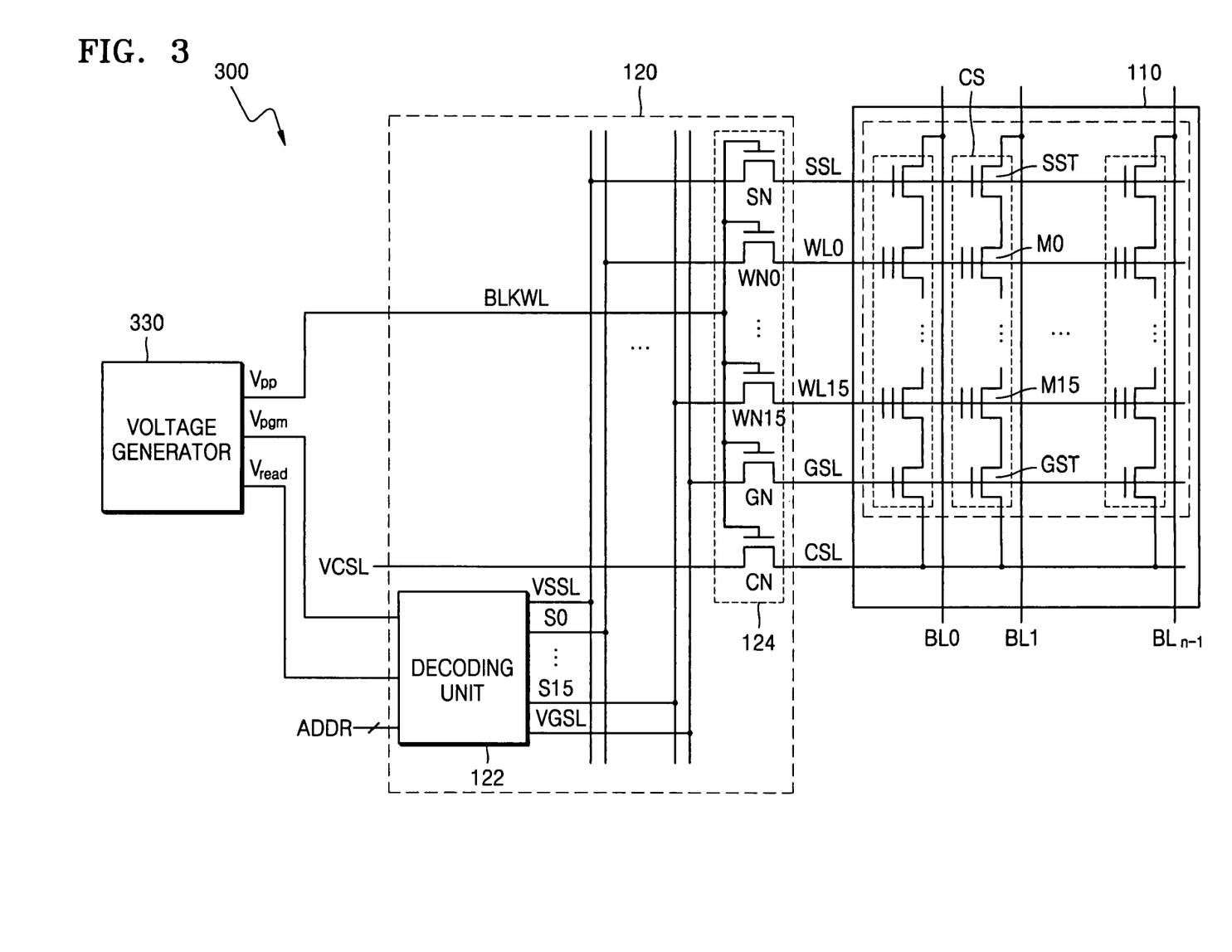
FIG. 3 is a block diagram of a flash memory device according to an embodiment.

FIG. 3 is a block diagram of a flash memory device 300 according to an embodiment. Referring to FIG. 3, the flash memory device 300 includes a block memory cell array 110, a wordline decoder 120, and a multi-voltage generator 330. The multi-voltage generator 330 replaces the high voltage generator 130, the program voltage generator 140 and the read voltage generator 150 of the flash memory device 100 of FIG. 1. The block memory cell array 110 and the wordline decoder 120 of the flash memory device 300 are identical to those of the conventional flash memory device 100 of FIG. 1, detailed explanations of those components are omitted.

Figure 4:
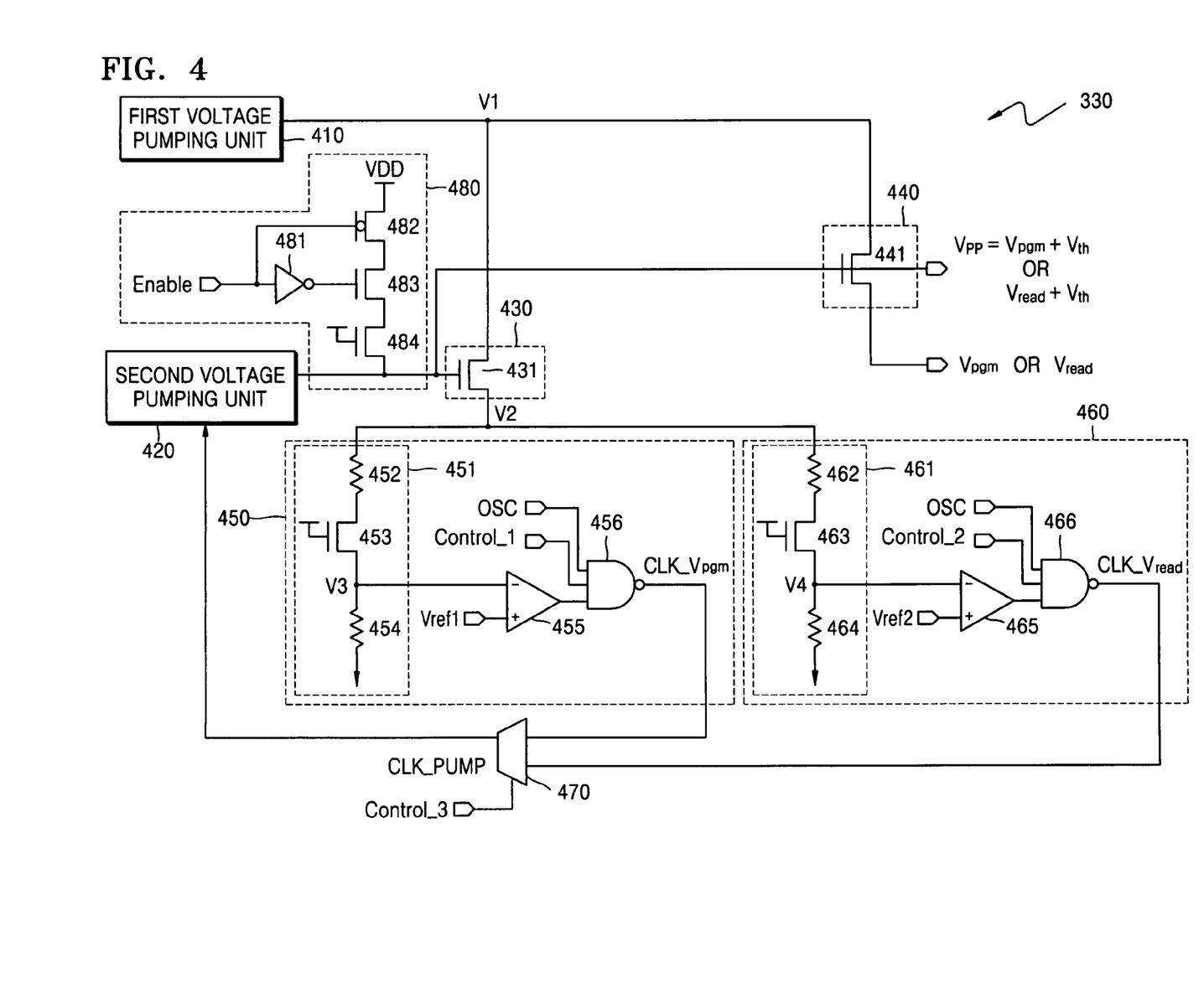
FIG. 4 illustrates a multi-voltage generator according to an embodiment.

The multi-voltage generator 330 generates a high voltage VPP, a program voltage Vpgm, and a read voltage Vread and provides them to the wordline decoder 120. The multi-voltage generator 330 is illustrated in detail in FIG. 4. Referring to FIG. 4, the multi-voltage generator 330 includes a first voltage pumping unit 410, a second voltage pumping unit 420, a first voltage transfer unit 430, a second voltage transfer unit 440, a first voltage regulator 450, a second voltage regulator 460, a selector 470, and a high voltage discharging unit 480.

The first voltage pumping unit 410 generates a first voltage V1 according to a charge pumping operation. The first voltage V1 can be the program voltage Vpgm, the read voltage Vread, or another control voltage used by the flash memory device 300. The second voltage pumping unit 420 pumps charges in response to a pumping enable clock signal CLK_PUMP applied thereto to generate the high voltage VPP. The pumping enable clock signal CLK_PUMP is provided by the selector 470 which will be explained later.

The first voltage transfer unit 430 may be an NMOS transistor 431 having a source connected to the first voltage V1, a gate connected to the high voltage VPP and a drain outputting a second voltage V2. The second voltage transfer unit may be of an NMOS transistor 441 having a source connected to the first voltage V1, a gate connected to the high voltage VPP and a drain outputting the program voltage Vpgm or the read voltage Vread of the flash memory device 300.

Preferably, the first and second voltage transfer units 430 and 440 include NMOS transistors 431 and 441 having substantially the same size. The first voltage V1, having a level corresponding to the program voltage Vpgm or the read voltage Vread generated by the first voltage pumping unit 410, is transferred through the NMOS transistor 431 in response to the high voltage VPP to become the second voltage V2. Similarly, the first voltage V1 is output as the program voltage Vpgm or the read voltage Vread of the flash memory device 300 through the NMOS transistor 441. As a result, the second voltage V2 becomes substantially identical to the program voltage Vpgm or the read voltage Vread actually used in the flash memory device 300.

In addition, the NMOS transistors 431 and 441 of the first and second voltage transfer units 430 and 440 may have substantially the same size as those of high-voltage pass transistors WN0 through WN10 of FIG. 1. In the flash memory device 300, the program voltage Vpgm or the read voltage Vread is applied to the wordlines WL0 through WL15 through the high-voltage pass transistors WN0 through WN15. Because, the NMOS transistors 431 and 441 have the same characteristic as those of the pass transistors WN0 through WN15, the program voltage Vpgm and the read voltage Vread applied to the wordlines WL0 through WL15 may be substantially the same as the second voltage V2.

For example, if the first voltage V1 corresponds to the program voltage Vpgm, the NMOS transistor 431 of the first voltage transfer unit 430 is turned on when the high voltage VPP is equal to the program voltage Vpgm plus the threshold voltage Vth of the NMOS transistor 431. Accordingly, the second voltage V2 becomes the program voltage Vpgm. Similarly, if that the first voltage V1 corresponds to the read voltage Vread, the NMOS transistor 431 is turned on when the high voltage VPP is equal to the read voltage Vread plus the threshold voltage Vth of the NMOS transistor 431. Thus, the second voltage level V2 becomes the read voltage level Vread.

The first voltage regulator 450 may be used to determine whether the second voltage V2 corresponds to the program voltage Vpgm and may generate a first pumping clock signal CLK_Vpgm. The first voltage regulator 450 may include a first voltage divider 451, a first comparator 455, and a first pumping clock controller 456.

The first voltage divider 451 may include a first resistor 452, a first transistor 453 and a second resistor 454 serially connected between the second voltage V2 and a ground voltage VSS. The first transistor 453 has a gate connected to a power supply voltage VDD, a source connected to the first resistor 452 and a drain connected to the second resistor 454. The node between the drain of the first transistor 453 and the second resistor 454 is a node of a third voltage V3. The first voltage divider 451 makes the third voltage V3 substantially identical to a first reference voltage Vref1 when the second voltage V2 corresponds to the program voltage Vpgm.

The first comparator 455 receives the third voltage V3 through its non-inverting port and receives the first reference voltage Vref1 through its inverting port to compare the third voltage V3 to the first reference voltage Vref1. The first comparator 455 outputs a logic high signal when the third voltage V3 is lower than the first reference voltage Vref1 and outputs a logic low signal when the third voltage V3 is identical to or higher than the first reference voltage Vref1.

The first pumping clock controller 456 is composed of a NAND gate that receives a clock signal OSC, a first control signal Control_1 and the output signal of the first comparator 455 to generate the first pumping clock signal CLK_Vpgm. The first pumping clock controller 456 generates the first pumping clock signal CLK_Vpgm in response to the clock signal OSC when the first control signal Control_1 instructing the voltage generator 330 to generate the program voltage Vpgm and the output signal of the first comparator 455 both have a logic high level. When any one of the first control signal Control_1 and the output signal of the first comparator 455 has a logic low level, the first pumping clock controller 456 does not generate the first pumping clock signal CLK_Vpgm. That is, the first pumping clock signal CLK_Vpgm is generated when the first control signal Control_1 is activated to a logic high level and the third voltage V3 is lower than the first reference voltage Vref1.

The second voltage regulator 460 may be used to determine whether the second voltage level V2 corresponds to the read voltage level Vread and may generate a second pumping clock signal CLK_Vread. The second voltage regulator 460 may include a second voltage divider 461, a second comparator 465, and a second pumping clock controller 466.

The second voltage divider 461 may include a third resistor 462, a second transistor 463 and a fourth resistor 464 serially connected between the second voltage V2 and the ground voltage VSS. The second transistor 463 has a gate connected to the power supply voltage VDD, a source connected to the third resistor 462 and a drain connected to the fourth resistor 464. The node between the drain of the second transistor 463 and the fourth resistor 464 is a node of a fourth voltage V4. The second voltage divider 461 makes the fourth voltage V4 substantially identical to a second reference voltage Vref2 when the second voltage V2 corresponds to the read voltage Vread.

The second comparator 465 receives the fourth voltage V4 through its non-inverting port and receives the second reference voltage Vref2 through its inverting port to compare the fourth voltage V4 to the second reference voltage Vref2. The second comparator 465 outputs a logic high signal when the fourth voltage V4 is lower than the second reference voltage Vref2 and outputs a logic low signal when the fourth voltage V4 is identical to or higher than the second reference voltage Vref2.

The second pumping clock controller 466 is composed of a NAND gate that receives the clock signal OSC, a second control signal Control_2 and the output signal of the second comparator 465 to generate the second pumping clock signal CLK_Vread. The second pumping clock controller 466 generates the second pumping clock signal CLK_Vread in response to the clock signal OSC when the second control signal Control_2 instructing the voltage generator 330 to generate the read voltage Vpgm and the output signal of the second comparator 465 both have a logic high level. When any one of the second control signal Control_2 and the output signal of the second comparator 465 has a logic low level, the second pumping clock controller 466 does not generate the second pumping clock signal CLK_Vread. That is, the second pumping clock signal CLK_Vread is generated when the second control signal Control_2 is activated to a logic high level and the fourth voltage V4 is lower than the second reference voltage Vref2. The selector 470 selects the first pumping clock signal CLK_Vpgm or the second pumping clock signal CLK_Vread in response to a third control signal Control_3 to output the selected one as a pumping enable signal CLK_PUMP. The third control signal Control_3 instructs the multi-voltage generator 330 to generate the program voltage Vpgm or the read voltage Vread. The selector 470 transmits the first pumping clock signal CLK_Vpgm as the pumping enable clock signal CLK_PUMP when the multi-voltage generator 330 generates the program voltage Vpgm. The selector 470 transmits the second pumping clock signal CLK_Vread as the pumping enable clock signal CLK_PUMP when the multi-voltage generator 330 generates the read voltage Vread.

The high voltage discharging unit 480 discharges the high voltage VPP to the power supply voltage VDD in response to an enable signal Enable for a recovery operation of the flash memory device 300 when the flash memory device 300 finishes the programming operation or the read operation. The high voltage discharging unit 480 may include an inverter 481, a PMOS transistor 482, and first and second NMOS transistors 483 and 484. The inverter 481 inverts the enable signal Enable. The PMOS transistor 482 has a source connected to the power supply voltage VDD and a gate connected to the enable signal Enable. The first NMOS transistor 483 has a source connected to the drain of the PMOS transistor 482 and a gate connected to the output of the inverter 481 signal. The second NMOS transistor 484 has a source connected to the drain of the first NMOS transistor 483, a gate connected to the power supply voltage VDD and a drain connected to the high voltage VPP.

In the high voltage discharging unit 480, the PMOS transistor 482 and the first NMOS transistor 483 are turned on when the enable signal Enable is activated to a logic low level. Accordingly, a current path from the high voltage VPP to the power supply voltage VDD is formed via the PMOS transistor 481 and the first and second NMOS transistors 483 and 484 such that the high voltage VPP is discharged to the power supply voltage level VDD.

The operation of the multi-voltage generator 330 in response to operation modes of the flash memory device will now be described.

When the flash memory device 300 is in a programming operation mode, the first voltage pumping unit 410 increases the first voltage V1 through a to the charge pumping operation and the second voltage pumping unit 420 increases the high voltage VPP through another charge pumping operation. The increasing first voltage V1 is transferred as the second voltage V2 through the NMOS transistor 441 of the second voltage transfer unit 440 turned on by the high voltage VPP. The third voltage V3 is lower than the first reference voltage Vref1 until the first and second voltages V1 and V2 become the corresponding program voltage Vpgm. Accordingly, the first pumping clock controller 456 generates the first pumping clock signal CLK_Vpgm in response to the first control signal Control_1 and the clock signal OSC. The first pumping clock signal CLK_Vpgm is output through the selector 470 as the pumping enable clock signal CLK_PUMP to be provided to the second voltage pumping unit 420. The second voltage pumping unit 420 increases the high voltage VPP in response to the pumping enable clock signal CLK_PUMP.

The first voltage V1 becomes substantially equal to the program voltage Vpgm through the charge pumping operation of the first voltage pumping unit 410, and the high voltage VPP becomes substantially equal to the program voltage Vpgm plus the threshold voltage Vth of the NMOS transistor 441 of the second voltage transfer unit 440 through the charge pumping operation of the second voltage pumping unit 420. The first voltage V1, having the program voltage level Vpgm, passes through the NMOS transistor 431, turned on by the high voltage VPP, to become the second voltage V2. The third voltage V3 becomes identical to the first reference voltage Vref1 because the second voltage V2 corresponds to the program voltage Vpgm. Accordingly, the output signal of the first comparator 455 becomes a logic low level and thus the first pumping clock signal CLK_Vpgm is set to a logic high level irrespective of the first control signal Control_1. The first pumping clock signal CLK_Vpgm set to a logic high level is output through the selector 470 as the pumping enable clock signal CLK_PUMP. The second voltage pumping unit 420 receiving the pumping enable clock signal CLK_PUMP set to a logic high level does not continue the charge pumping operation. Thus, the high voltage VPP generated by the second voltage pumping unit 420 corresponds to the program voltage Vpgm plus the threshold voltage Vth of the NMOS transistor 441 of the second voltage transfer unit 440.

When the flash memory device 300 is in a read operation mode, the first voltage pumping unit 410 increases the first voltage V1 through the charge pumping operation and the second voltage pumping unit 420 increases the high voltage VPP through the charge pumping operation. The increasing first voltage V1 is transferred as the second voltage V2 through the NMOS transistor 441 of the second voltage transfer unit 440 turned on by the high voltage VPP. The fourth voltage V4 is lower than the second reference voltage Vref2 until the first and second voltages V1 and V2 become substantially equal to the read voltage Vread. Accordingly, the second pumping clock controller 466 generates the second pumping clock signal CLK_Vread in response to the second control signal Control_2 and the clock signal OSC. The second pumping clock signal CLK_Vread is output through the selector 470 as the pumping enable clock signal CLK_PUMP to be provided to the second voltage pumping unit 420. The second voltage pumping unit 420 increases the high voltage VPP in response to the pumping enable clock signal CLK_PUMP.

The first voltage V1 becomes substantially equal to the read voltage Vread through the charge pumping operation of the first voltage pumping unit 410. The high voltage VPP becomes substantially equal to the read voltage Vread plus the threshold voltage Vth of the NMOS transistor 441 of the second voltage transfer unit 440 through the charge pumping operation of the second voltage pumping unit 420. The first voltage V1, having the read voltage level Vpgm, passes through the NMOS transistor 431, turned on by the high voltage VPP, to become the second voltage V2. The fourth voltage V4 becomes substantially identical to the second reference voltage Vref2 when the second voltage V2 corresponds to the read voltage Vread. Accordingly, the output signal of the second comparator 465 becomes a logic low level and thus the second pumping clock signal CLK_Vread is set to a logic high level irrespective of the second control signal Control_2. The second pumping clock signal CLK_Vread set to a logic high level is output through the selector 470 as the pumping enable clock signal CLK_PUMP. The second voltage pumping unit 420 receiving the pumping enable clock signal CLK_PUMP set to a logic high level does not continue the charge pumping operation. Thus, the high voltage VPP generated by the second voltage pumping unit 420 corresponds to the read voltage Vread plus the threshold voltage Vth of the NMOS transistor 441 of the second voltage transfer unit 440.

Accordingly, an embodiment generates the program voltage Vpgm, read voltage Vread and high voltage Vpp in response to the operation modes of the flash memory device using a single multi-voltage generator. The multi-voltage generator 330 carries out a voltage pumping operation only until the high voltage VPP becomes higher than the program voltage Vpgm or read voltage Vread plus the threshold voltage Vth of the NMOS transistor 441. Accordingly, the flash memory device as described above does not have unnecessary power consumption as compared to the conventional flash memory device from generating the high voltage VPP fixed to a sufficiently high level irrespective of the program voltage Vpgm. Furthermore, the multi-voltage generator 330 can simply generate the high voltage corresponding to the program voltage Vpgm or read voltage Vread plus the threshold voltage of the NMOS transistor 441 without having the trimming operation required for changing the levels of the high voltage VPP, program voltage Vpgm and read voltage Vread.

Accordingly, the area of a flash memory device may be remarkably decreased if the high voltage VPP, the program voltage Vpgm and the read voltage Vread are selectively generated using an integrated single voltage generator.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A multi-voltage generator for a flash memory device comprising:
   a control voltage pumping unit configured to generate a control voltage;
   a high voltage pumping unit configured to generate a high voltage in response to an enable signal;
   a voltage transfer unit coupled to the control voltage pumping unit and the high voltage pumping unit, the voltage transfer unit configured to transfer the control voltage in response to the high voltage;
   a plurality of voltage regulators, each regulator coupled to the voltage transfer unit, and configured to generate a pumping signal in response to the transferred control voltage; and
   a selector configured to select one of the pumping signals as the enable signal.

2. The multi-voltage generator of claim 1, wherein:
   the control voltage pumping unit is configurable to generate a read voltage as the control voltage and configurable to generate a program voltage as the control voltage; and
   further comprising a second voltage transfer unit coupled to the control voltage pumping unit and the high voltage pumping unit, and configured to transfer the control voltage as the read voltage or the program voltage for the flash memory device in response to the high voltage.

3. The multi-voltage generator of claim 2, wherein the first and second voltage transfer units each further comprises a transistor having substantially the same size as the transistor of the other voltage transfer unit.

4. The multi-voltage generator of claim 1, wherein the voltage transfer unit further comprises a transistor having:
   a gate coupled to the high voltage pumping unit;
   a source coupled to the plurality of voltage regulators; and
   a drain coupled to the control voltage pumping unit.

5. The multi-voltage generator of claim 1, wherein the plurality of voltage regulators further comprises:
   a first voltage regulator configured to generate the first voltage regulator pumping signal if the high voltage is less than a program voltage plus a threshold value; and
   a second voltage regulator configured to generate the second voltage regulator pumping signal if the high voltage is less than a read voltage plus the threshold value.

6. The multi-voltage generator of claim 1, wherein each voltage regulator further comprises:
   a voltage divider configured to generate a divided voltage in response to the high voltage;
   a comparator configured to compare the divided voltage and a reference voltage; and
   a pumping controller configured to generate the pumping signal in response to the comparator and a control signal.

7. The multi-voltage generator of claim 1, further comprising a discharge circuit configured to discharge the high voltage to a supply voltage.

8. A multi-voltage generator of a flash memory device comprising:
   a first voltage pumping unit configured to generate a first voltage;
   a second voltage pumping unit configured to generate a high voltage in response to a pumping enable clock signal;
   a first voltage transfer unit configured to transfer the first voltage to a second voltage in response to the high voltage;
   a first voltage regulator configured to receive the second voltage and configured to generate a first pumping clock signal;
   a second voltage regulator configured to receive the second voltage and configured to generate a second pumping clock signal; and
   a selector configured to receive the first and second pumping clock signals and configured to selectively output one of the first and second pumping clock signals as the pumping enable signal.

9. The multi-voltage generator of claim 8, wherein the first voltage pumping unit further configured to increase the first voltage until the first voltage becomes substantially equal to one of a program voltage and a read voltage.

10. The multi-voltage generator of claim 8, wherein the second voltage pumping unit further configured to increase the high voltage until the high voltage becomes substantially equal to one of a program voltage and a read voltage plus a threshold voltage of the first voltage transfer unit.

11. The multi-voltage generator of claim 10, wherein the first voltage transfer unit further comprises a transistor having a gate configured to receive the high voltage, a source configured to generate the second voltage and a drain configured to receive the first voltage.

12. The multi-voltage generator of claim 8, further comprising a second voltage transfer unit configured to transfer the first voltage as a program voltage or a read voltage in response to the high voltage.

13. The multi-voltage generator of claim 12, wherein the second voltage transfer unit further comprises a transistor having a gate configured to receive the high voltage, a drain configured to receive the first voltage and a source configured to generate one of the program voltage and the read voltage.

14. The multi-voltage generator of claim 8, wherein each of the first voltage regulator and the second voltage regulator further comprises:
   a voltage divider configured to generate a divided voltage having the same level as a reference voltage when the second voltage is substantially equal to a desired voltage, the desired voltage being the program voltage for the first voltage regulator and the read voltage for the second voltage regulator;
   a comparator configured to compare the divided voltage to the reference voltage; and
   a pumping clock controller configured to generate the pumping clock signal in response to the output signal of the comparator, a control signal instructing the multi-voltage generator to generate the desired voltage and a clock signal.

15. A multi-voltage generator for a flash memory device comprising:
   a high voltage pumping unit configured to generate a high voltage in response to an enable signal;
   a plurality of voltage regulators, each regulator coupled to the high voltage and a control voltage, and configured to generate a pumping signal;
   a selector configured to select one of the pumping signals as the enable signal; and a voltage transfer unit coupled between the high voltage pumping unit and the plurality of voltage regulators, the voltage transfer unit including a transistor having:

a gate coupled to the high voltage pumping unit;
a source coupled to the plurality of voltage regulators; and
a drain coupled to a control voltage pumping unit.

16. A multi-voltage generator for a flash memory device comprising:
a high voltage pumping unit configured to generate a high voltage in response to an enable signal;
a plurality of voltage regulators, each regulator coupled to the high voltage and a control voltage, and configured to generate a pumping signal; and
a selector configured to select one of the pumping signals as the enable signal;

wherein the plurality of voltage regulators further comprises:
a first voltage regulator configured to generate the first voltage regulator pumping signal if the high voltage is less than a program voltage plus a threshold value; and
a second voltage regulator configured to generate the second voltage regulator pumping signal if the high voltage is less than a read voltage plus the threshold value.

* * * * *

UNITED STATES PATENT AND TRADEMARK OFFICE
CERTIFICATE OF CORRECTION

PATENT NO.       : 7,433,236 B2  
APPLICATION NO.  : 11/361118  
DATED            : October 7, 2008  
INVENTOR(S)      : Hyun-Chul Ha et al.

Page 1 of 1

It is certified that error appears in the above-identified patent and that said Letters Patent is hereby corrected as shown below:

Column 1, line 57, the word "MO" should read -- M0 --;  
Column 2, line 45, the word "VI" should read -- V1 --.

Signed and Sealed this

Twenty-fourth Day of February, 2009

JOHN DOLL  
*Acting Director of the United States Patent and Trademark Office*